United States Patent
Kaneda et al.

(10) Patent No.: US 12,267,469 B2
(45) Date of Patent: Apr. 1, 2025

(54) IMAGE FORMING APPARATUS INCLUDING A DOUBLE-STRUCTURED BOTTLE COVER

(71) Applicants: Ryuta Kaneda, Kanagawa (JP); Hiroaki Nieda, Kanagawa (JP); Naoki Matsuda, Kanagawa (JP)

(72) Inventors: Ryuta Kaneda, Kanagawa (JP); Hiroaki Nieda, Kanagawa (JP); Naoki Matsuda, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 18/387,851

(22) Filed: Nov. 8, 2023

(65) Prior Publication Data

US 2024/0171690 A1    May 23, 2024

(30) Foreign Application Priority Data

Nov. 18, 2022   (JP) .................. 2022-185203

(51) Int. Cl.
| | |
|---|---|
| H04N 1/00 | (2006.01) |
| G06K 15/00 | (2006.01) |
| H05K 5/02 | (2006.01) |
| H05K 5/03 | (2006.01) |
| H05K 7/14 | (2006.01) |

(52) U.S. Cl.
CPC ....... *H04N 1/00519* (2013.01); *G06K 15/407* (2013.01); *H04N 1/00543* (2013.01); *H05K 5/0221* (2013.01); *H05K 5/03* (2013.01); *H05K 7/1405* (2013.01)

(58) Field of Classification Search
None
See application file for complete search history.

(56) References Cited

U.S. PATENT DOCUMENTS

| | | | | |
|---|---|---|---|---|
| 2006/0039718 | A1* | 2/2006 | Yokoi | G03G 15/0194 399/124 |
| 2006/0159482 | A1* | 7/2006 | Okada | G03G 15/80 399/88 |
| 2015/0084272 | A1* | 3/2015 | Maruyama | G03G 15/6529 271/226 |
| 2018/0052419 | A1* | 2/2018 | Maeda | G03G 21/1842 |
| 2020/0379372 | A1* | 12/2020 | Nohara | G03G 15/0886 |
| 2022/0004141 | A1 | 1/2022 | Kita et al. | |

(Continued)

FOREIGN PATENT DOCUMENTS

| | | | | |
|---|---|---|---|---|
| EP | 1538001 | A1 * | 6/2005 | B41J 2/473 |
| JP | 2005-091462 | A | 4/2005 | |
| JP | 2007279273 | A * | 10/2007 | |

(Continued)

OTHER PUBLICATIONS

JP-2007279273-A English Translation (Year: 2007).*
Ueno (JP-2008051132-A) English Translation, 4th page, last paragraph of Translation (Year: 2008).*

*Primary Examiner* — Miya J Cato
(74) *Attorney, Agent, or Firm* — XSENSUS LLP (57) ABSTRACT

An image forming apparatus includes an apparatus main body and a cover to openably close the apparatus main body in a front-back direction. The cover includes an inner cover and an exterior cover outside the inner cover in the front-back direction. The exterior cover is fitted to the inner cover to form a single body with the inner cover.

5 Claims, 10 Drawing Sheets

(56) References Cited

U.S. PATENT DOCUMENTS

2023/0341802 A1 * 10/2023 Hiramatsu ........... G03G 15/556

FOREIGN PATENT DOCUMENTS

| JP | 2008051132 A | * | 3/2008 |
|----|--------------|---|--------|
| JP | 2011-008142 A | | 1/2011 |
| JP | 2011-059296 A | | 3/2011 |
| JP | 2021006852 A | * | 1/2012 |
| JP | 2019035833 A | * | 3/2019 |
| JP | 2021-099432 A | | 7/2021 |

* cited by examiner

IMAGE FORMING APPARATUS INCLUDING A DOUBLE-STRUCTURED BOTTLE COVER

CROSS-REFERENCE TO RELATED APPLICATION

This patent application is based on and claims priority pursuant to 35 U.S.C. § 119(a) to Japanese Patent Application No. 2022-185203, filed on Nov. 18, 2022, in the Japan Patent Office, the entire disclosure of which is hereby incorporated by reference herein.

BACKGROUND

Technical Field

Embodiments of the present disclosure relate to an image forming apparatus.

Related Art

In the related art, an image forming apparatus includes an opening and closing member configured to be openable and closable with respect to an apparatus main body.

SUMMARY

This specification describes an improved image forming apparatus that includes an apparatus main body and a cover to openably close the apparatus main body in a front-back direction. The cover includes an inner cover and an exterior cover. The exterior cover is outside the inner cover in the front-back direction. The exterior cover is fitted to the inner cover to form a single body with the inner cover.

BRIEF DESCRIPTION OF THE DRAWINGS

A more complete appreciation of embodiments of the present disclosure and many of the attendant advantages and features thereof can be readily obtained and understood from the following detailed description with reference to the accompanying drawings, wherein.

The accompanying drawings are intended to depict embodiments of the present disclosure and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Referring now to the drawings, embodiments of the present disclosure are described below. As used herein, the singular forms "a," "an," and "the" are intended to include the plural forms as well, unless the context clearly indicates otherwise.

With reference to drawings, descriptions are given below of embodiments of the present disclosure. In the drawings illustrating embodiments of the present disclosure, elements or components having identical or similar functions or shapes are given similar reference numerals as far as distinguishable, and redundant descriptions are omitted.

The following describes an electrophotographic image forming apparatus according to an embodiment of the present disclosure.

Figure 1:
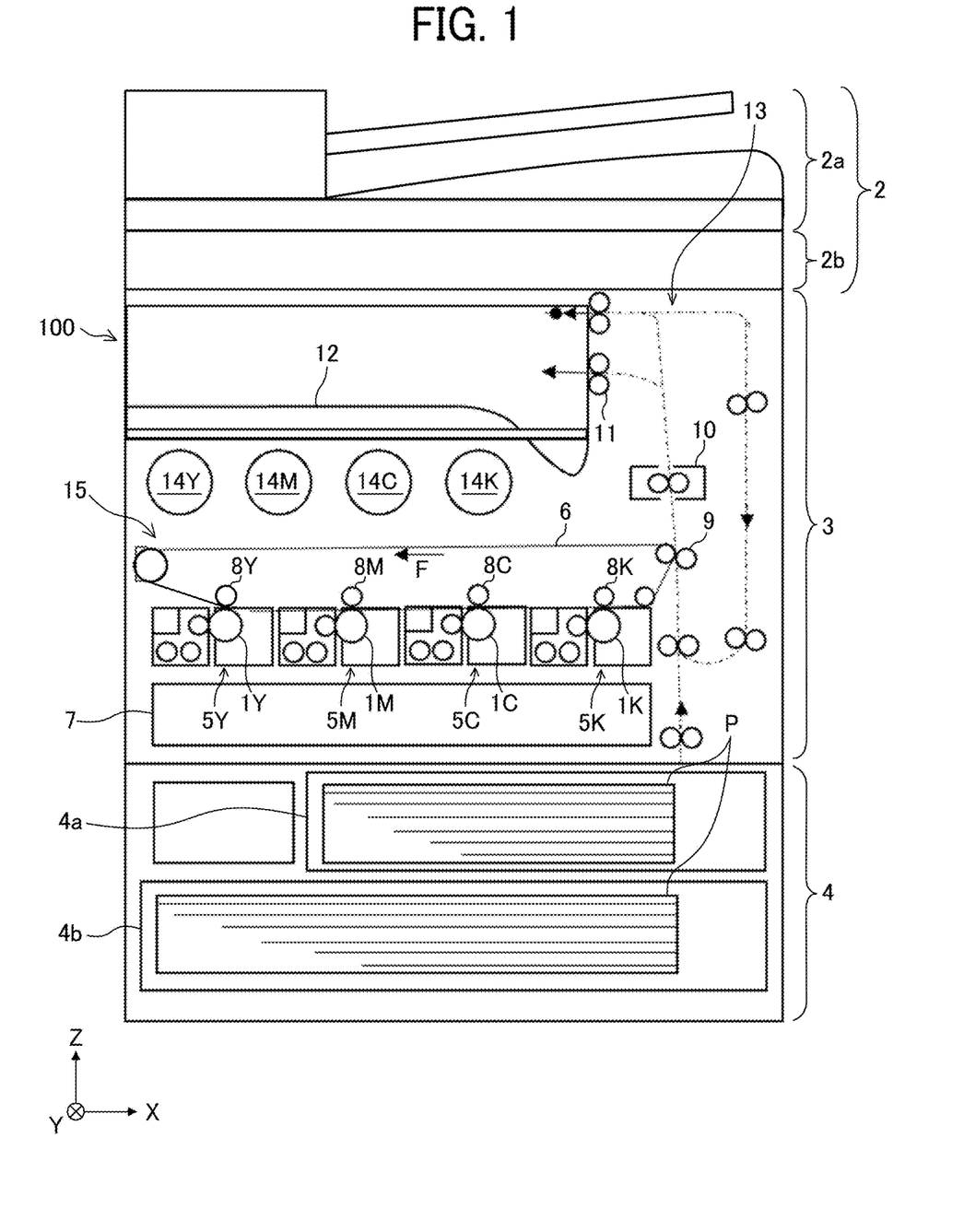
FIG. 1 is a schematic diagram illustrating a configuration of an image forming apparatus according to an embodiment of the present disclosure.

FIG. 1 is a schematic diagram illustrating a configuration of an image forming apparatus 100 according to the present embodiment.

In FIG. 1, a vertical direction in the image forming apparatus 100 is indicated by an arrow Z, a front-back direction in the image forming apparatus 100 is indicated by an arrow Y, and a left and right direction in the image forming apparatus 100 is indicated by an arrow X.

The image forming apparatus 100 includes an image forming section 3, a sheet feeding section 4, and an image reading device 2 that reads an image of a document as an image forming target. The image reading device 2 is disposed above the image forming section 3 and includes a document feeder 2a and a scanner 2b. The sheet feeding section 4 is disposed below the image forming section 3 and includes two sheet trays 4a and 4b for storing sheets P.

The image forming section 3 includes an intermediate transfer unit 15 as an image former including an intermediate transfer belt 6 and four image forming units 5Y, 5M, 5C, and 5K for forming respective color images. The image forming units also serve as image former. The intermediate transfer belt 6 rotates in a direction indicated by an arrow F in FIG. 1. The image forming units 5Y, 5M, 5C, and 5K are arranged along the intermediate transfer belt 6. The image forming units 5Y. 5M, 5C, and 5K include photoconductors 1Y, 1M, 1C, and 1K, respectively, as drum-shaped image bearers. In addition, the image forming section 3 includes an exposure device 7.

The intermediate transfer unit 15 includes the intermediate transfer belt 6 having an endless shape and wound around multiple support rollers, primary transfer rollers 8Y, 8C, 8M, and 8K, and a belt cleaner to clean the surface of the intermediate transfer belt 6. The primary transfer rollers 8Y, 8M, 8C, and 8K are disposed inside the loop of the intermediate transfer belt 6 and transfer the toner images from the photoconductors 1Y, 1M, 1C, and 1K onto the intermediate transfer belt 6. A secondary transfer roller 9 is disposed downstream from the primary transfer rollers 8Y, 8M, 8C, and K in a direction that the intermediate transfer belt 6 moves. The secondary transfer roller 9 faces the intermediate transfer belt 6. In addition, the image forming section 3 includes a fixing device 10 to fix an image onto the sheet P and an output roller pair 11 that are above the secondary transfer roller 9.

The four image forming units 5Y, 5M, 5C, and 5K have a similar configuration except for the color of toner used therein. In the following description, the suffixes Y, M, C, and K are omitted when color discrimination is not necessary. Around a photoconductor 1, the image forming unit 5 includes a charging device to charge the surface of the photoconductor 1 and a developing device to develop a latent image on the photoconductor 1 with toner into a toner image. Additionally, the image forming unit 5 includes a cleaning device to clean the surface of the photoconductor 1 after the toner image is transferred from the photoconductor 1 to the intermediate transfer belt 6.

Operations of the image forming apparatus 100 according to the present embodiment are described below.

In response to receiving a start signal to start image formation, a controller 50 as circuitry in the image forming apparatus 100 controls a driver to start rotating the intermediate transfer belt 6. The driver also starts rotating the photoconductor 1Y in the image forming unit 5Y to form the yellow toner image, and the charging device uniformly charges the photoconductor 1Y. The exposure device 7 irradiates the photoconductor 1Y with a laser beam to form an electrostatic latent image. The developing device develops the electrostatic latent image to form the yellow toner image on the photoconductor 1Y. Similarly, the image forming units 5M, 5C, and 5K form a magenta toner image, a cyan toner image, and a black toner image on the photoconductors 1M, 1C, and 1K, respectively. With the movement of the intermediate transfer belt 6, the primary transfer rollers 8Y, 8M, 8C, and 8K sequentially transfer the yellow, magenta, cyan, and black toner images from the photoconductors 1Y, 1M, 1C, and 1K to the intermediate transfer belt 6, respectively to form a composite color image on the intermediate transfer belt 6. The controller 50 performs the image forming operations for forming the yellow, magenta, cyan, and black toner images at different timings from the upstream side to the downstream side in the direction that the intermediate transfer belt 6 moves so that the yellow, magenta, cyan, and black toner images are transferred to and superimposed on the same position of the intermediate transfer belt 6.

On the other hand, the sheet feeding section 4 feeds the sheet P from the upper sheet tray 4a or the lower sheet tray 4b, and conveyance rollers convey the sheet P to a secondary transfer nip formed by the intermediate transfer belt 6 and the secondary transfer roller 9. The secondary transfer roller 9 transfers the composite color image on the intermediate transfer belt 6 onto the sheet P to form a color image on the sheet P. The sheet P bearing the color image is sent to the fixing device 10 to fix the color image onto the sheet P. After the color image is fixed onto the sheet P in the fixing device 10, the output roller pair 11 ejects the sheet P to stack the sheet P on an output tray 12, or the sheet P is sent to a reverse path 13 to form a toner image on the other side of the sheet P.

The cleaning device in each of the image forming units 5Y, 5M, 5C, and 5K cleans residual toner on each of the photoconductors 1Y, 1M, 1C, and 1K after the toner image is transferred. The belt cleaner cleans residual toner on the intermediate transfer belt 6 after the composite color image is transferred.

The above-described image formation consumes toner in each of the developing device. The image forming apparatus 100 includes toner bottles 14Y, 14M, 14C, and 14K filled with yellow, magenta, cyan, and black toners, respectively and illustrated on the upper left side in FIG. 1. A predetermined amount of toner is supplied from each toner bottle to each developing device through a toner conveyance path. The arrangement order of the four image forming units 5Y, 5M, 5C, and 5K and the toner bottles 14Y, 14M. 14C, and 14K is not limited to the example illustrated in FIG. 1.

When the image forming apparatus 1) according to the present embodiment forms a copy of the document, the document having a sheet shape is set on the document feeder 2a of the image reading device 2. After the document is set on the document feeder 2a, pushing a copy start switch causes the image reading device 2 to start a document reading operation. Specifically, the document feeder 2a conveys the document, and the scanner 2b reads the document.

In parallel with the document reading operation, the devices in the image forming units 5Y, 5M, 5C, and 5K, the intermediate transfer belt 6, the secondary transfer roller 9, and the fixing device 10 start operations. Based on image data read by the image reading device 2, the exposure device 7 is driven and controlled to form the yellow, magenta, cyan, and black toner images on the photoconductors 1Y, 1M, 1C, and 1K, respectively.

The yellow, magenta, cyan, and black toner images are transferred onto the intermediate transfer belt 6 and superimposed on the intermediate transfer belt 6 to form a four color toner image.

Almost simultaneously with the start of the document reading operation, the sheet feeding section 4 starts a sheet feeding operation. The sheet feeding section 4 includes the sheet trays 4a and 4b accommodated and overlapped in the image forming apparatus 100. In the sheet feeding operation, one of the sheet trays 4a and 4b feeds the sheet P. The conveyance rollers convey the fed sheet P toward the secondary transfer nip.

Figure 2A:
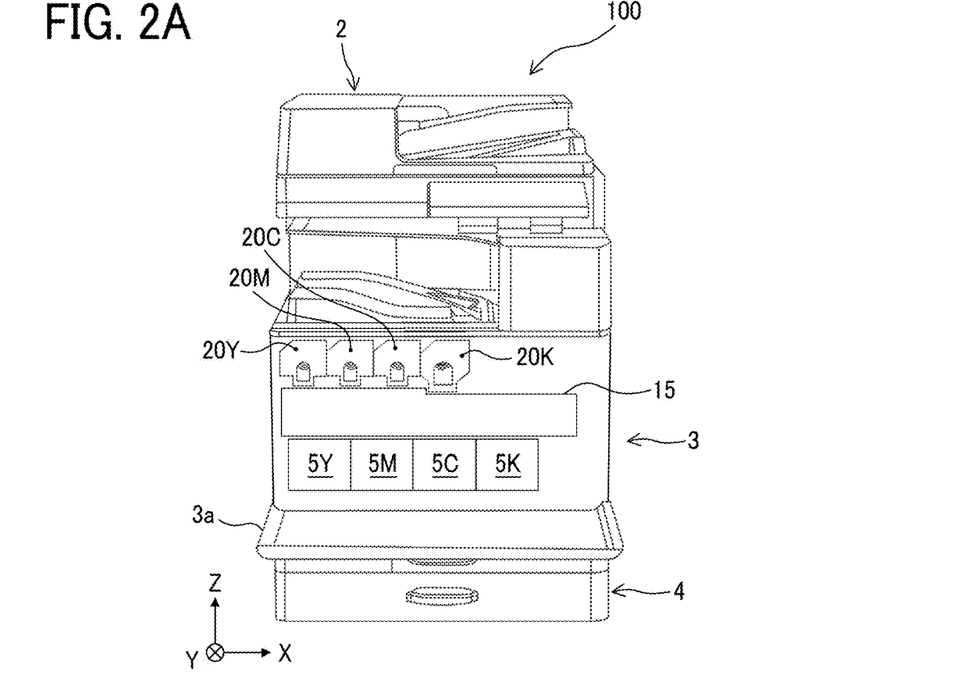
FIG. 2A is a front view of the image forming apparatus in which a front cover is opened.
Figure 2B:
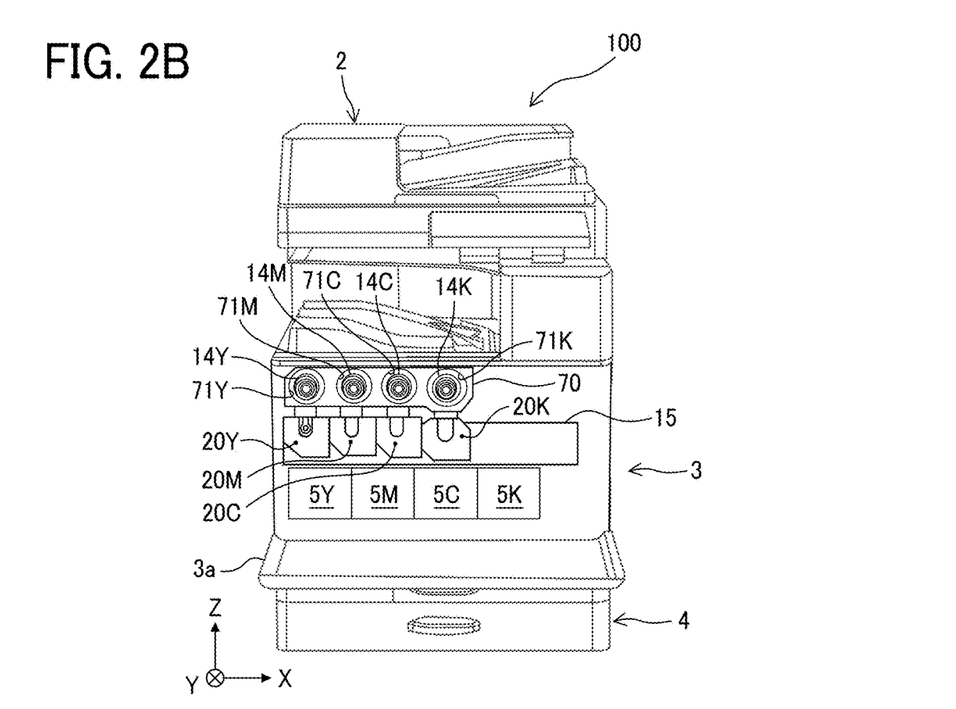
FIG. 2B is a front view of the image forming apparatus in which the front cover and bottle covers are opened.

FIG. 2A is a front view of the image forming apparatus 100 in which a front cover 3a is opened, and FIG. 2B is a front view of the image forming apparatus 100 in which the front cover 3a and bottle covers 20Y, 20M, 20C, and 20K are opened.

As illustrated in FIG. 2A, the lower end of the front cover 3a is rotatably supported by the image forming section 3. Opening the front cover 3a exposes the image forming units 5Y, 5M, 5C, and 5K and the intermediate transfer unit 15 including the intermediate transfer belt 6 and the primary transfer rollers 8Y, 8M. 8C, and 8K. As a result, the intermediate transfer unit 15 and the image forming units can be attached to and detached from the image forming apparatus 100.

In addition, opening the front cover 3a exposes the bottle covers 20Y, 20M, 20C, and 20K that open and close bottle insertion openings 71Y. 71M. 71C, and 71K of a bottle housing 70 of the image forming section 3. Opening the bottle covers 20Y, 20M, 20C, and 20K as an opening and closing member exposes the toner bottles 14Y, 14M, 14C, and 14K stored in the bottle housing 70 of the image forming section 3, and the toner bottles 14Y. 14M, 14C, and 14K can be attached to and detached from the bottle insertion openings 71Y, 71M, 71C, and 71K, respectively.

Lock devices 40 (see FIGS. 4A and 4B), which are described below, lock the bottle covers 20Y, 20M, 20C, and 20K at closed positions at which the bottle covers 20Y, 20M, 20C, and 20K cover the bottle insertion openings 71Y, 71M, 71C, and 71K, respectively. In response to toner depletion of any one of the yellow, magenta, cyan, and black toners in the toner bottles, the controller 50 controls the lock device to unlock the bottle cover corresponding to the toner depletion.

In the present embodiment, opening the front cover 3a exposes the bottle covers 20Y, 20M, 20C, and 20K, the intermediate transfer unit 15, and the image forming units 5Y, 5M 5C, and 5K. Opening the front cover 3a enables opening and closing the bottle cover, inserting the intermediate transfer unit 15 and the image forming units 5Y, 5M, 5C, and 5K into the apparatus main body, and pulling out the intermediate transfer unit 15 and the image forming units 5Y. 5M, 5C, and 5K from the apparatus main body. The above-described structure can reduce the number of covers from a structure in which opening front cover 3a exposes only the bottle cover. As a result, the above-described structure can reduce the number of components of the image forming apparatus and the cost of the image forming apparatus.

Figure 3:
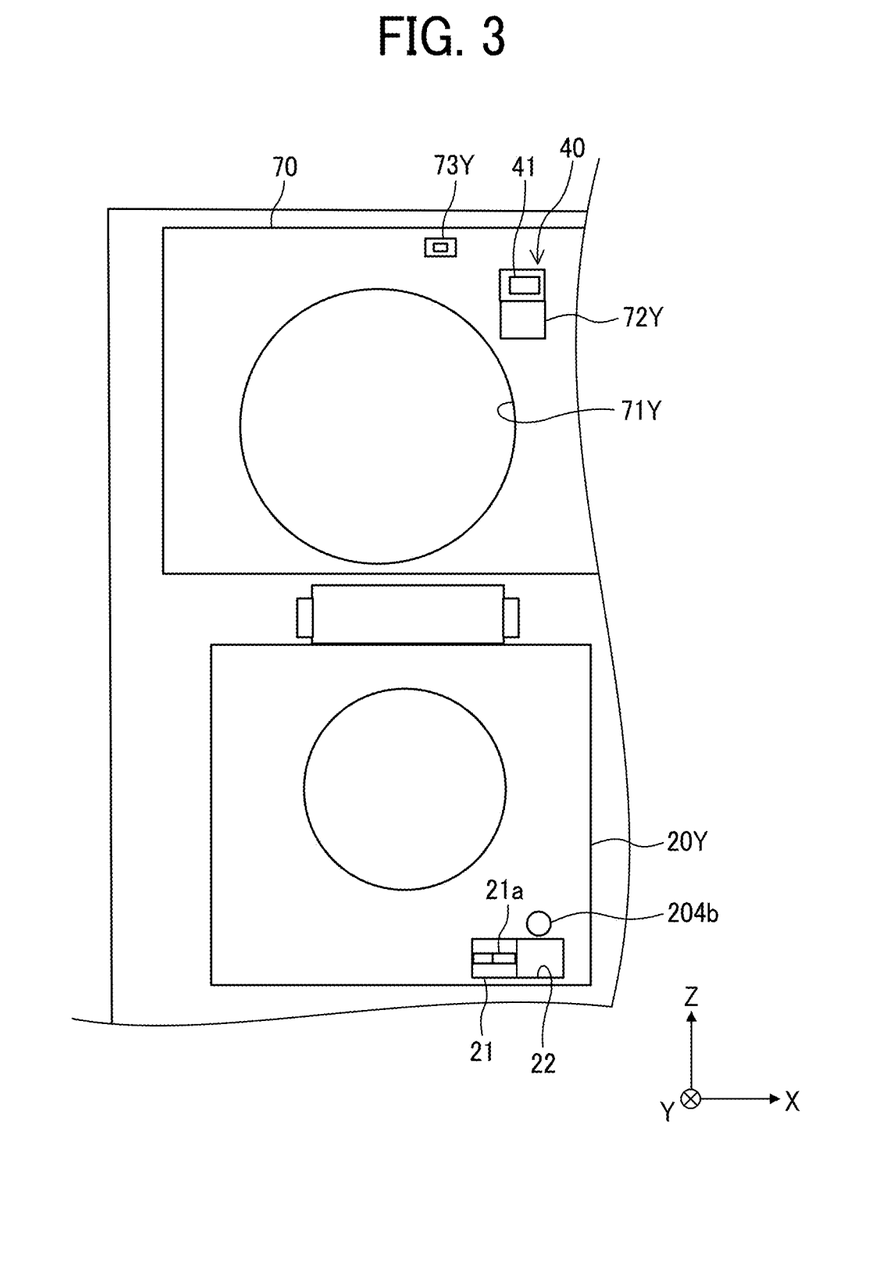
FIG. 3 is an enlarged schematic diagram of the bottle cover and parts around the bottle cover.

FIG. 3 is an enlarged schematic diagram of the bottle cover 20Y and parts around the bottle cover 20Y.

Above the bottle insertion opening 71Y, the lock device 40 and an opening and closing switch 73Y are disposed. The lock device 40 locks the bottle cover 20Y at the closed position. The opening and closing switch 73Y detects whether the bottle cover 20Y is closed or opened. Under the lock device 40, a contact portion 72Y is disposed. The bottle cover 20Y includes a presser 204 including a projection 204b. The projection 204b contacts the contact portion 72Y.

The bottle cover 20Y has a locked portion 21 and a lock claw housing 22. The lock device 40 includes a lock lever 41 having a lock claw 41a. The lock claw 41a enters the lock claw housing 22 and engages the locked portion 21.

The bottle covers 20M, 20C, and 20K and lock devices 40 facing the bottle covers 20M, 20C, and 20K are similarly configured.

Figure 4A:
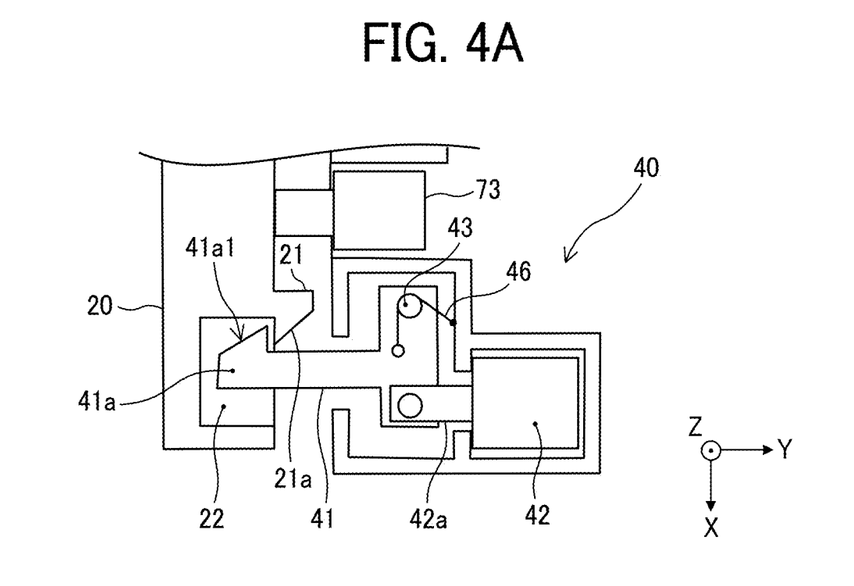
FIGS. 4A and 4B are schematic diagrams each illustrating a configuration of a lock device viewed from above.
Figure 4B:
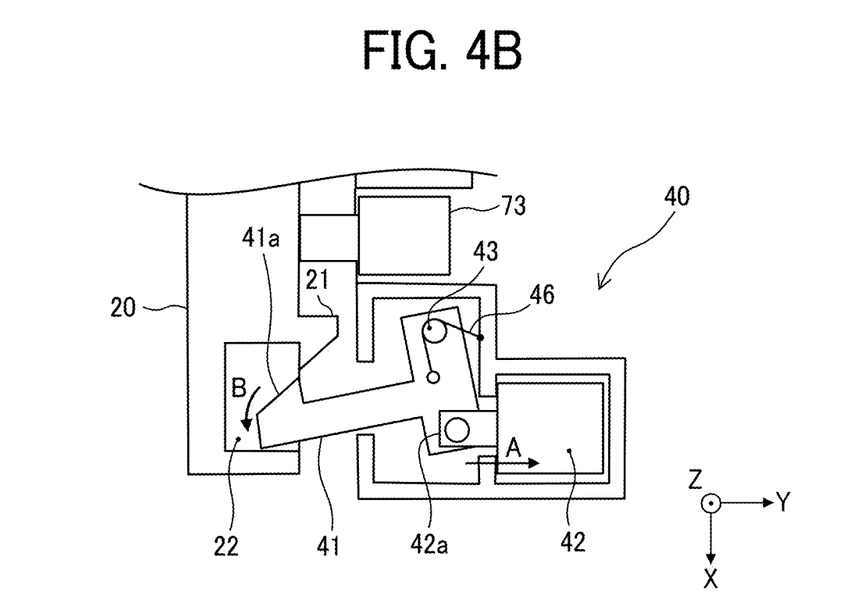

FIGS. 4A and 4B are schematic diagrams each illustrating a configuration of the lock device 40 viewed from above. In FIG. 4A, the lock device 40 locks the bottle cover 20. In FIG. 4B, the lock device 40 unlocks the bottle cover 20.

In the following description, color-coded symbols Y. M. C. and K are omitted as appropriate because the configurations of the bottle covers containing yellow toner, magenta toner, cyan toner, and black toner are the same.

The lock device 40 includes a solenoid 42 and the lock lever 41 including the lock claw 41a at a tip of the lock lever 41. The lock device 40 includes a support shaft 43 rotatably supporting the lock lever 41. The lock device 40 includes a torsion spring 46 serving as a biasing member attached to the support shaft 43. The torsion spring 46 applies a force to the lock lever 41 to be positioned at a lock position illustrated in FIG. 4A. The lock lever 41 is rotatably attached to a plunger 42a (a movable metallic core) of the solenoid 42.

As illustrated in FIG. 4A, the bottle cover 20 has the locked portion 21 and the lock claw housing 22 into which the lock claw 41a of the lock lever 41 enters.

When the bottle cover 20 is locked at a closed position, the lock claw 41a of the lock lever 41 enters the lock claw housing 22 and faces the locked portion 21. The lock claw 41a is in front of the locked portion 21 in the bottle cover 20. In the above-described structure, opening the bottle cover 20 causes the locked portion 21 to butt the lock claw 41a. As a result, the bottle cover 20 is locked at the closed position.

As illustrated in FIG. 4B, energizing the solenoid 42 generates an electromagnetic force pulling the plunger 42a in a direction indicated by an arrow A illustrated in FIG. 4B. The plunger 42a rotates the lock lever 41 in a direction indicated by an arrow B in FIG. 4B against the force applied by the torsion spring 46. As a result, the lock claw 41a of the lock lever 41 does not face the locked portion 21, and the lock is released. Thus, the bottle cover 20 can be opened.

A biasing force of a pressing spring 203 (see FIG. 11) automatically rotates the bottle cover 20 to an open position.

Cutting off the energization of the solenoid 42 loses the electromagnetic force pulling the plungers 42a, and the force applied by the torsion spring 46 rotates the lock lever 41 clockwise in FIG. 4B to position the lock lever 41 at the lock position. Subsequently, closing the bottle cover 20 causes a projection 21a of the locked portion 21 to butt against an inclined portion 41a1 of the lock claw 41a. Further closing the bottle cover 20 causes the lock lever 41 to rotate counterclockwise in FIGS. 4A and 4B and causes the lock claw 41a to climb over the locked portion 21 into the lock claw housing 22. After the lock claw 41a enters the lock claw housing 22, the force applied by the torsion spring 46 rotates the lock lever 41 clockwise in FIG. 4A. As a result, the lock claw 41a faces the locked portion 21, and the bottle cover 20 is locked.

In addition, an upper portion of the bottle cover 20 at the closed position pushes the opening and closing switch 73 to turn on the opening and closing switch 73. On the other hand, opening the bottle cover 20 turn off the opening and closing switch 73. As a result, the opening and closing switch 73 can detect opening and closing of the bottle cover 20.

Figure 5:
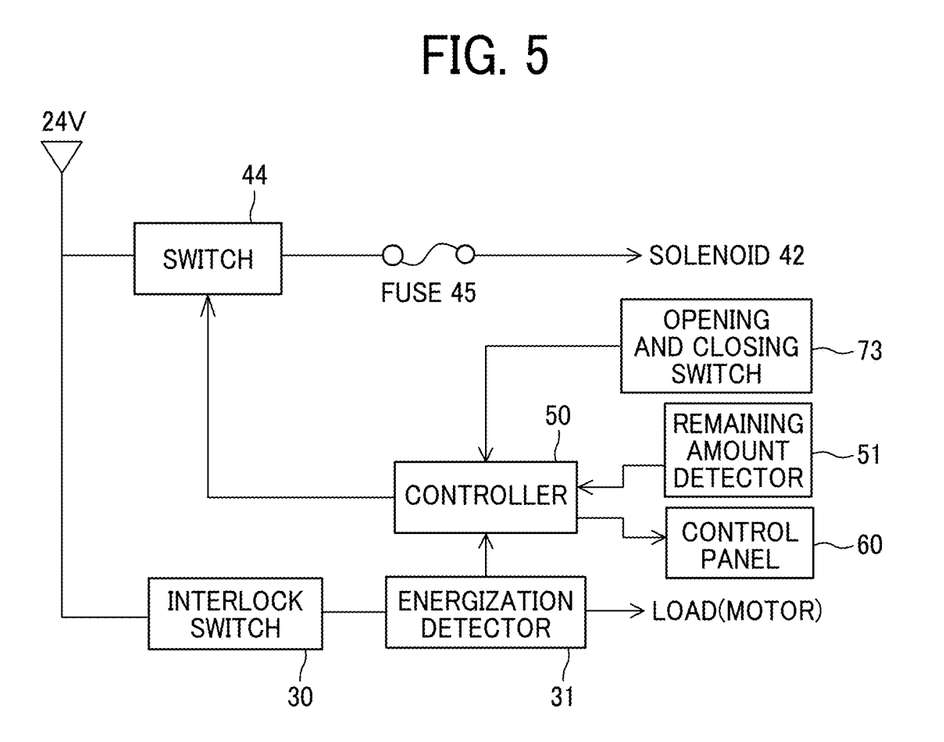
FIG. 5 is a block diagram of a circuit to drive a solenoid.

FIG. 5 is a block diagram of a circuit to drive the solenoid 42.

As illustrated in FIG. 5, the solenoid 42 is coupled to a 24V power supply via a switch 44 and a fuse 45. Opening the front cover 3a turns off an interlock switch 30 to cut off an electrical connection between the 24V power supply and a load (i.e., an electric component) such as a motor for the image forming section 3. Between the interlock switch 30 and the load, an energization detector 31 is disposed to detect whether a voltage is applied from the 24V power supply to the load. When opening the front cover 3a turns off the interlock switch 30, the energization detector 31 detects that no voltage is applied to the load (0V). As a result, the controller 50 can detect that the front cover 3a is opened. On the other hand, when closing the front cover 3a turns on the interlock switch 30, the energization detector 31 detects that the voltage is applied to the load. As a result, the controller 50 can detect that the front cover 3a is closed. As described above, the opening-and-closing detector in the present embodiment to detect whether the front cover 3a is opened or closed includes the interlock switch 30 and the energization detector 31.

Alternatively, the opening-and-closing detector to detect whether the front cover 3a is opened or closed may include, for example, a filler disposed on the front cover 3a and an optical sensor to detect the filler. Based on an output voltage from the optical sensor, the controller 50 may determine whether the front cover 3a is opened or closed. The opening-and-closing detector may include a magnet disposed on the front cover 3a and a magnetic sensor to detect a magnetic force of the magnet. Based on an output voltage from the magnetic sensor, the controller 50 may determine whether the front cover 3a is opened or closed. However, the interlock switch 30 to detect whether the front cover 3a is opened or closed has the following advantage. The openingand-closing detector including the interlock switch 30 can reduce the number of components to be smaller than other opening and closing detectors including additional components to detect whether the front cover 3a is opened or closed. As a result, the cost of the image forming apparatus can be reduced.

The controller 50 is coupled to the energization detector 31, a remaining amount detector 51 that detects the amount of toner remaining in each of the toner bottles 14Y, 14M. 14C, and 14K, a control panel 60, the switch 44 that turns on or off the energization of the solenoid 42, and the opening and closing switch 73 that detects the opening and closing the bottle cover 20.

The remaining amount detector 51 may use any one of various detection methods.

For example, the remaining amount detector 51 may determine the amount of toner remaining in each of the toner bottles based on a calculation result of a toner consumption amount in each color image that can be calculated from a number of sheets printed and other factors.

Alternatively, the remaining amount detector 51 may determine the amount of toner remaining in each of the toner bottles based on an electrostatic capacity in each of the toner bottles 14 or an electrostatic capacity in a toner conveyance path to convey each toner from the toner bottle 14 to the corresponding developing device.

The remaining amount detector 51 may use a toner supply system that supply the toner to the developing device. For example, the toner supply system includes a toner concentration sensor detecting a toner concentration in developer in the developing device, and the controller control a toner supply system to supply the toner to the developing device so that the toner concentration detected by the toner concentration sensor is in a target toner concentration range. Alternatively, the toner supply system may include an optical sensor detecting an image density of an image pattern formed on the photoconductor or the intermediate transfer belt, and the controller controls the toner supply system to supply the toner to the developing device so that the image density detected by the optical sensor is in a target image density range. When the toner density or the image density does not reach the target value although the toner is supplied by the above-described toner supply system, the controller can determine that the toner depletion occurs in the toner bottle. As described above, the remaining amount detector 51 may be formed.

The remaining amount detector 51 may use a toner remaining amount sensor assembled to a sub-hopper on the toner conveyance path between the toner bottle 14 and the corresponding developing device. The toner depletion in the toner bottle causes a decrease in an amount of toner in the sub-hopper. When the toner remaining amount sensor detects amounts of toner that each are equal to or smaller than an experimentally determined amount of toner for an experimentally determined time, the controller can determine that the toner depletion occurs in the toner bottle.

When the remaining amount detector 51 detects the toner depletion of any one of the yellow, magenta, cyan, and black toners in the toner bottles 14, the controller 50 controls the control panel 60 to display a notification indicating the toner bottle in which the toner depletion is detected and an instruction to replace the toner bottle with a new toner bottle 14. In addition, the controller 50 determines whether the front cover 3a is opened based on detection results of the energization detector 31 that detects whether the interlock switch 30 is turned on or off when the remaining amount detector 51 detects the toner depletion. In response to determination that the front cover 3a is opened, the controller 50 turns on the switch 44.

As a result, the 24V power supply supplies electric power to the solenoid 42 to open the lock of the bottle cover 20 corresponding to the toner bottle in which the toner depletion is detected.

Subsequently, the controller 50 determines whether the opening and closing switch 73 is turned off after the predetermined time has passed since the 24V power supply supplies the electric power to the solenoid 42. If the opening and closing switch 73 is not turned off and cannot detect the opening of the bottle cover 20, the controller 50 controls the control panel 60 to display an error message.

In the present embodiment, opening the front cover 3a turns off the interlock switch 30 but does not turn off the switch 44 to supply power to the solenoid 42. If the solenoid 42 causes a short circuit, an excessive current flows to the solenoid 42. The fuse 45 shuts off the excessive current to protect circuits in the apparatus main body.

Figure 6:
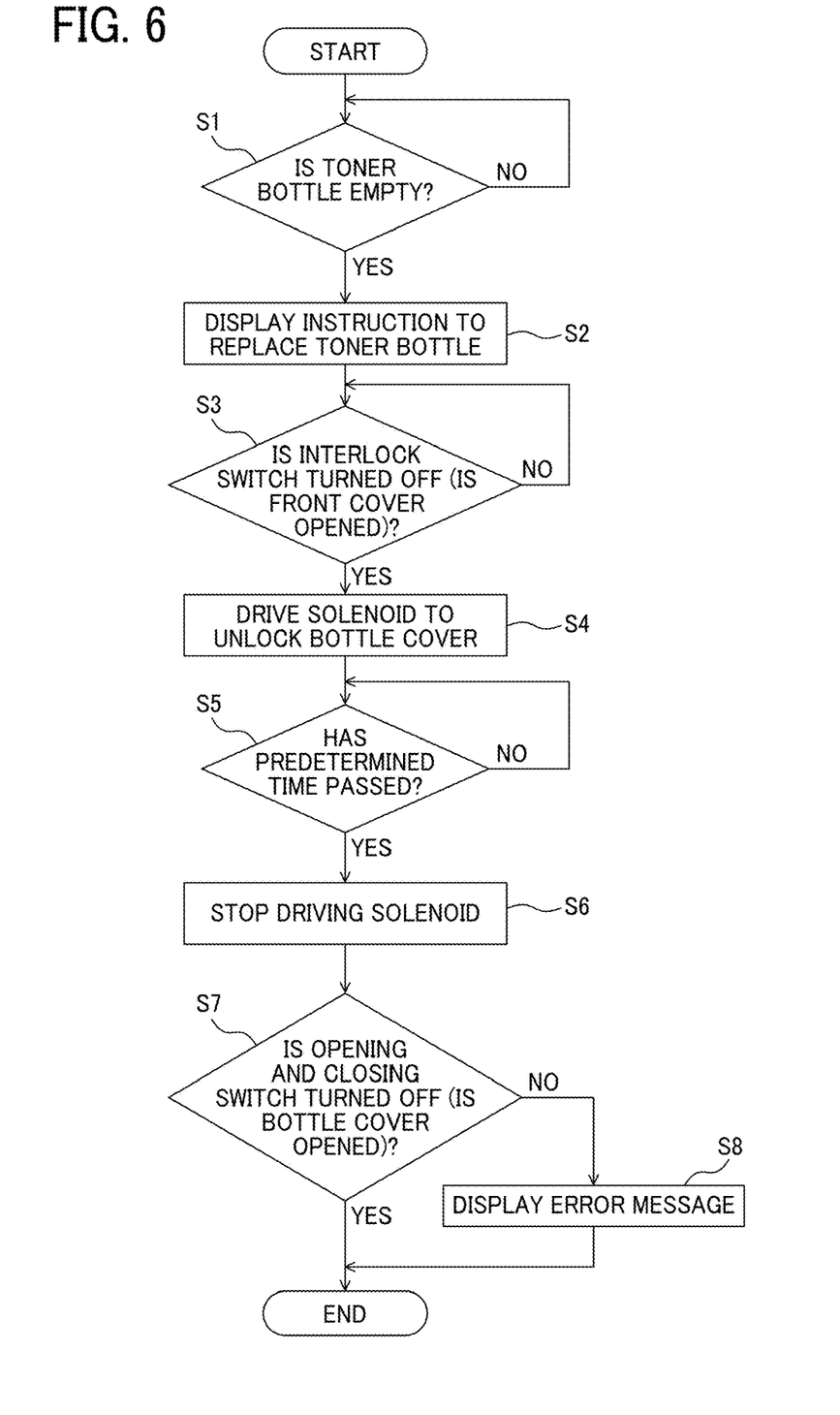
FIG. 6 is a flowchart of control to unlock the bottle cover.

FIG. 6 is a flowchart of control to unlock the bottle cover 20.

When the remaining amount detector 51 detects the toner depletion of any one of the yellow, magenta, cyan, and black toners in the toner bottles 14 (Yes in step S1), the controller 50 controls the control panel 60 to display the instruction to replace the toner bottle in which the toner depletion is detected with a new toner bottle 14 in step S2.

The user opens the front cover 3a to replace the toner bottle 14 with a new one. Opening the front cover 3a turns off the interlock switch 30, and the controller 50 detects that the front cover 3a has been opened (Yes in S3).

After the controller 50 detects that the front cover 3a is opened, the controller 50 turns on the switch 44 to energize the solenoid 42 and drives the solenoid 42 in step S4. The driven solenoid 42 rotates the lock lever 41 to unlock the bottle cover 20 as described above. As a result, the above-described control opens the bottle cover 20 corresponding to the toner bottle 14 in which the toner depletion is detected together with the front cover 3a and exposes the toner bottle 14 in which the toner depletion is detected. Opening the bottle cover 20 corresponding to the toner bottle 14 in which the toner depletion is detected as described above enables the user to easily specify the toner bottle 14 to be replaced, and the replacement workability of the toner bottle 14 can be enhanced.

After the controller 50 turns on the switch 44 to start energization of the solenoid 42, the controller 50 starts measuring time. In response to the elapse of a predetermined amount of time (Yes in step S5), the controller 50 turns off the switch 44 to cut off the energization to the solenoid 42 and stop the driving of the solenoid 42 in step S6.

Subsequently, the controller 50 determines whether the opening and closing switch 73 is turned off in step S7. If the opening and closing switch 73 is turned on (No in step S7), the bottle cover 20 is not physically opened and some abnormality may occur. Accordingly, the controller 50 controls the control panel 60 to display the error message together with a notification that the bottle cover 20 corresponding to the toner bottle 14 in which the toner depletion is detected is not opened in step S8.

In the present embodiment, the controller 50 detects that the front cover 3a is opened in response to turning off the interlock switch 30 and unlocks the bottle cover corresponding to the toner bottle in which the toner depletion is detected. Unlocking the bottle cover causes opening the bottle cover 20 together with the front cover 3a. Since the bottle cover is opened, the controller 50 may stop driving the solenoid 42 and return the lock lever 41 to the lock position to lock the bottle cover in response to the elapse of the predetermined amount of time after the start of driving of the solenoid 42. The above-described structure and control can reduce the energization time to the solenoid 42. For example, the controller 50 may energize the solenoid 42 to unlock the bottle cover 20 after the remaining amount detector 51 detects the toner depletion and cut off the energization to the solenoid 42 after the controller 50 detects that the bottle cover 20 is opened. However, the energization time to the solenoid 42 in such a structure and control is longer than the energization time to the solenoid 42 in the present embodiment.

In the present embodiment, the controller 50 unlocks the bottle cover corresponding to the toner bottle in which the toner depletion is detected, and the bottle cover corresponding to the toner bottle in which the toner depletion is detected automatically opens. The above-described structure and control can enhance the replacement workability of the toner bottle 14 to be better than an image forming apparatus in which the user operates the control panel 60 to unlock the bottle cover corresponding to the toner bottle in which the toner depletion is detected.

In the present embodiment, the solenoid 42 rotates the lock lever 41, but the present disclosure is not limited to this. For example, a gear mechanism may rotate the lock lever 41.

Figure 7:
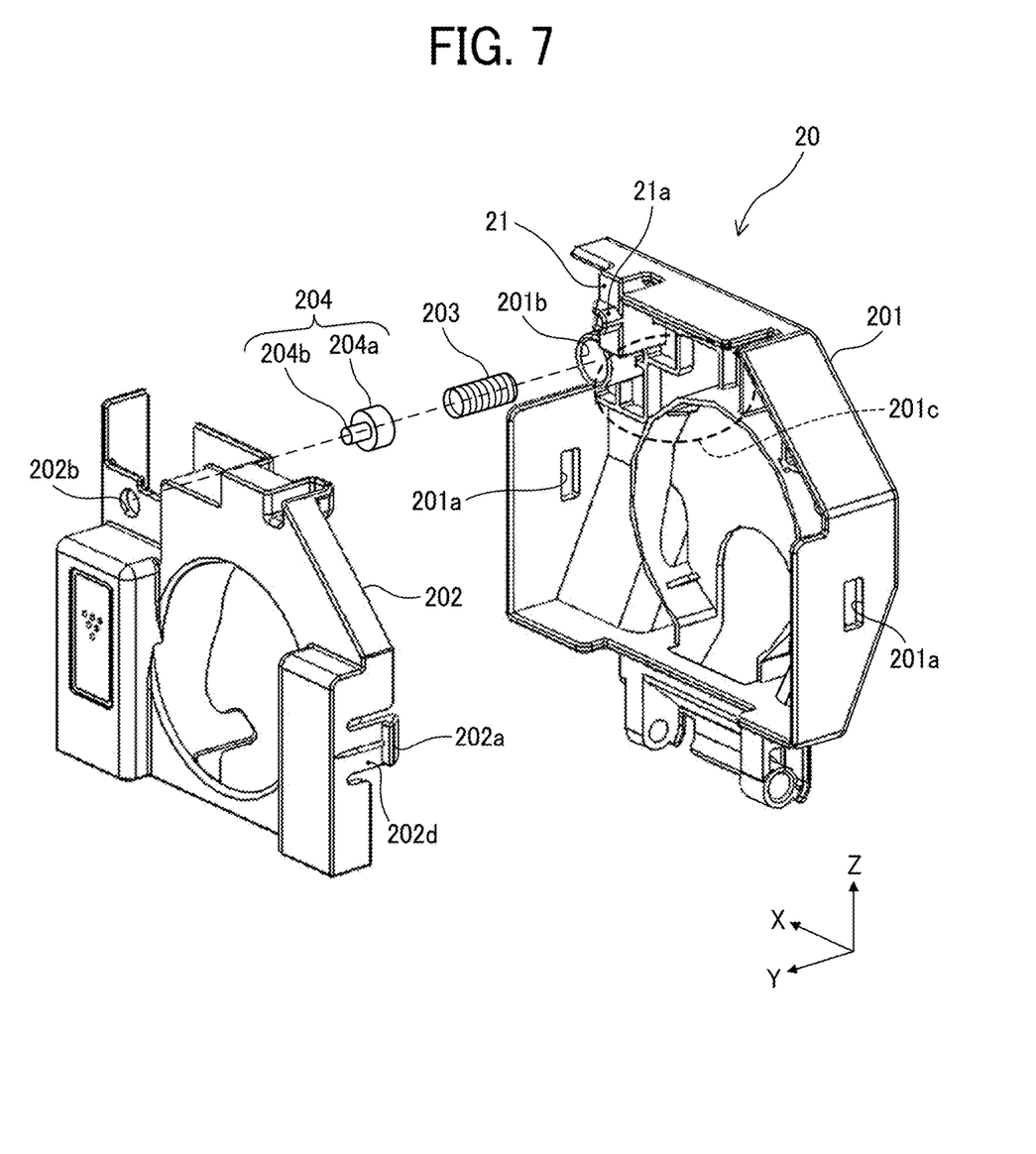
FIG. 7 is an exploded perspective view of the bottle cover.
Figure 8:
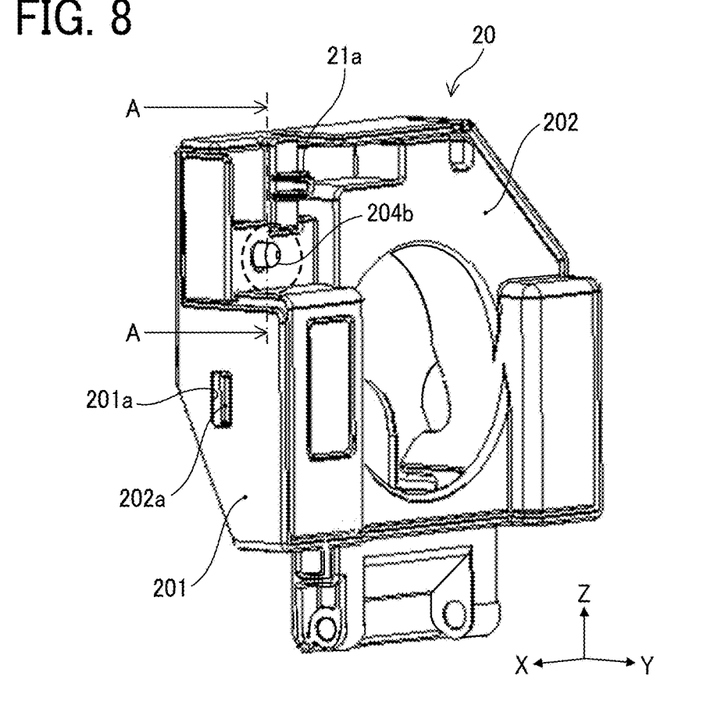
FIG. 8 is a perspective view of the bottle cover.
Figure 9:
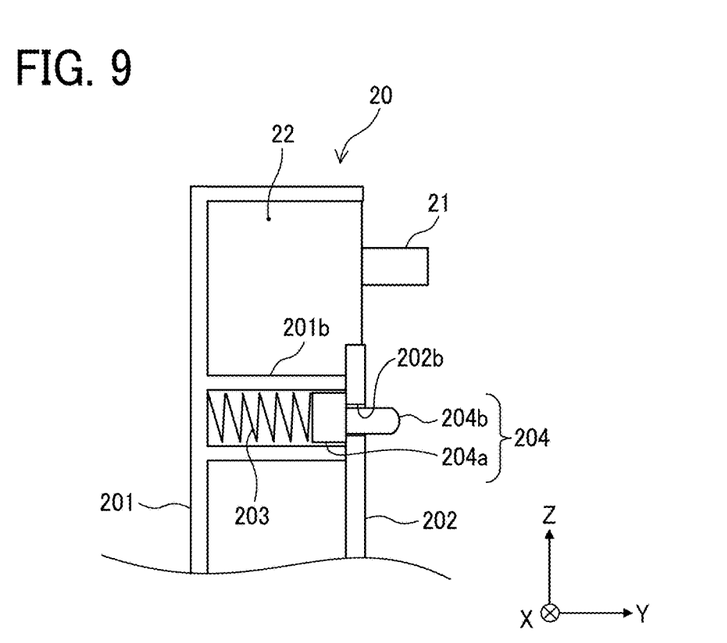
FIG. 9 is a cross-sectional view taken along line A-A in FIG. 8.

FIG. 7 is an exploded perspective view of the bottle cover 20, and FIG. 8 is a perspective view of the bottle cover 20. FIG. 9 is a cross-sectional view of the bottle cover 20 taken along line A-A in FIG. 8. The bottle cover as a cover openably close the apparatus main body in the front-back direction.

The bottle cover 20 has a double structure including an exterior cover 201 serving as an exterior member and an inner cover 202 serving as an inner member. In other words, the bottle cover as a cover includes the inner cover 202 and the exterior cover 201 outside the inner cover 202 in the front-back direction, and the exterior cover 201 is fitted to the inner cover 202 to form a single body with the inner cover 202.

The exterior cover 201 is positioned outside the inner cover 202 in the bottle cover 20 closed, and the inner cover 202 is positioned inside the exterior cover 201 in the bottle cover 20 closed.

Both sides of the exterior cover 201 in the X direction (that is the left and right direction in the image forming apparatus) have rectangular hook holes 201*a* to which hooks 202*a* of the inner cover 202 are hooked. The exterior cover 201 includes a cylindrical presser housing 201*b* to house the pressing spring 203 and the presser 204. The pressing spring 203 is in a space surrounded by the inner cover 202 and the exterior cover 201. In addition, the exterior cover 201 includes reinforcing ribs 201*c* facing the inner cover 202, and the inner cover 202 covers the reinforcing ribs 201*c*. In other words, the inner cover 202 surrounds the reinforcing rib 201*c*.

As illustrated in FIG. 9, the presser 204 includes the projection 204*b* projecting from a through hole 202*b* of the inner cover 202 and a pressing portion 204*a*. The pressing portion 204*a* contacts the inner cover 202 to perform a function of preventing the presser 204 from coming off. The pressing portion 204*a* has a function of pressing the inner cover 202 in a direction away from the exterior cover 201. In other words, the pressing spring 203 presses the inner cover 202 and the exterior cover 201 in a direction separating the inner cover 202 away from the exterior cover 201. As a result, the projection 204*b* in the bottle cover at the closed position contacts the apparatus main body that presses the presser 204 toward the exterior cover 201 to separate the pressing portion 204*a* from the inner cover 202.

The inside diameter of the presser housing 201*b* is larger than the outside diameter of the pressing portion 204*a* of the presser 204, and the presser housing 201*b* houses the presser 204 so as to be movable in the Y direction (that is the front-back direction). The pressing spring 203 is compressed and housed in the presser housing 201*b*. The biasing force of the pressing spring 203 presses the inner cover 202 and the exterior cover 201 to be away from each other in the Y direction.

As illustrated in FIG. 7, the inner cover 202 has elastic deformation portions 202*d* in both sides of the inner cover 202 in the X direction that is the left and right direction. The elastic deformation portion 202*d* is at substantially the center of the side of the inner cover 202 in the Z direction that is the vertical direction in FIG. 7 and can elastically deform. The hook 202*a* is disposed at the tip of the elastic deformation portion 202*d*. The inner cover 202 has the through hole 202*b*. The projection 204*b* of the presser 204 passes through and projects from the through hole 202*b*. The inner cover 202 includes reinforcing ribs 202*c* (see FIG. 10) facing the exterior cover 201, and the exterior cover 201 covers the reinforcing ribs 202*c*. In other words, the exterior cover 201 surrounds the reinforcing rib 202*c*.

The inner cover 202 is slightly smaller than the exterior cover 201 and is attached to the exterior cover 201 so as to be accommodated in the exterior cover 201. When the inner cover 202 is attached to the exterior cover 201, the tips of the hooks 202*a* come into contact with edges of the sides of the exterior cover 201 having the hook holes 201*a*. Then, the elastic deformation portions 202*d* are elastically deformed inward, and the hooks 202*a* are moved into the exterior cover. As a result, the inner cover 202 can enter the exterior cover 201. While the inner cover 202 is moved into the exterior cover, the presser 204 compresses the pressing spring 203 housed in the presser housing 201*b* of the exterior cover 201. The hooks 202*a* reach the positions of the hook holes 201*aa*, the elastic deformation portions 202*d* are restored, and the hooks 202*a* enter the hook holes 201*a*. As a result, the inner cover 202 is fitted to the exterior cover 201 as illustrated in FIG. 8.

In the present embodiment, the inner cover 202 is assembled to the exterior cover 201 by a so-called snap-fit in which the hook 202*a* is hooked to the hook hole 201*a*. The snap-fit enables assembling the inner cover 202 to the exterior cover 201 without using a tool, which can simplify the assembling workability. Alternatively, the exterior cover 201 may have hooks, and the inner cover 202 may have hook holes.

The bottle cover 20 having low rigidity is likely to cause deformation such as distortion and is easily jolted. The bottle cover 20 is closed by an operation of the user. At this time, the bottle cover 20 having the low rigidity is likely to deform, and the quality feeling is poor. Providing the reinforcing ribs on the bottle cover 20 can enhance the rigidity of the bottle cover 20. However, the reinforcing rib exposed to the outside may impair the aesthetic appearance of the device. Further, depending on the shape of the reinforcing rib, the user may be injured by touching the reinforcing rib.

In the present embodiment, the bottle cover 20 has the double structure including the exterior cover 201 and the inner cover 202. Fitting the inner cover 202 to the exterior cover 201 overlays the inner cover 202 on the exterior cover 201 with almost no gap in the Z direction and the X direction. Specifically, a portion extending outward from the outer periphery of the inner cover 202 (a portion extending in the −Y direction) overlays a portion extending inward from the outer periphery of the exterior cover 201 (a portion extending in the +Y direction) with substantially no gap. A force twisting one of the exterior cover 201 and the inner cover 202 causes the portion extending from the outer periphery of the one of the exterior cover 201 and the inner cover 202 in the Y direction abuts against the portion extending from the outer periphery of the other one of the exterior cover 201 and the inner cover 202 in the Y direction. The above-described structure prevents the one of the exterior cover 201 and the inner cover 202 from deforming and can enhance the rigidity of the bottle cover 20. A configuration in which the inner cover 202 is fitted to the exterior cover 201 without a gap is preferable because jolting the inner cover 202 with respect to the exterior cover 201 in a direction orthogonal to the Y direction can be prevented.

Figure 10:
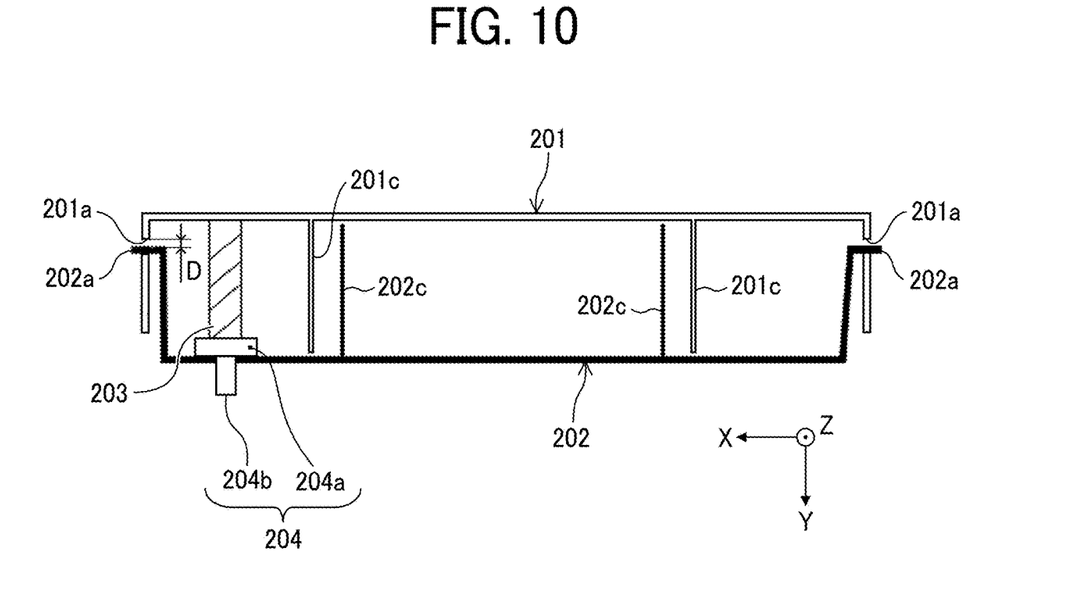
FIG. 10 is a schematic cross-sectional view of the bottle cover.

The reinforcing ribs 202c of the inner cover 202 and the portion extending outward from the outer periphery of the inner cover 202 face the face of the exterior cover 201 orthogonal to the Y direction, and the reinforcing ribs 201c of the exterior cover faces the face of the inner cover 202 orthogonal to the Y direction. When a force bends or twists one of the inner cover 202 and the exterior cover 201, a portion facing the face of the other one of the inner cover 202 and the exterior cover 201 orthogonal to the Y direction, such as the reinforcing ribs buts on the face of the other one of the inner cover 202 and the exterior cover 201. The above-described structure can prevent the occurrence of bending and twisting and increase the rigidity of the bottle cover 20.

The bottle cover 20 having the double structure including the exterior cover 201 and the inner cover 202 is less likely to be distorted as compared with the bottle cover 20 configured by a single member and can reduce the occurrence of rattling. In addition, when the user closes the bottle cover, occurrence of deformation can be prevented, and deterioration of quality feeling can also be prevented.

Although the inner cover 202 is fitted to the exterior cover 201 in the present embodiment, the rigidity of the bottle cover 20 can be increased as long as the inner cover 202 and the exterior cover 201 overlay each other with substantially no gap in the Y direction, the Z direction, and the X direction when the inner cover 202 and the exterior cover 201 are combined.

FIG. 10 is a schematic cross-sectional view of the bottle cover 20 in the present embodiment.

As illustrated in FIG. 10, the inner cover 202 covers the reinforcing ribs 201c of the exterior cover 201, and the exterior cover 201 covers the reinforcing ribs 202c of the inner cover 202. As described above, the bottle cover 20 in the present embodiment does not expose the reinforcing ribs 201c and 202c to the outside. As a result, compared to the bottle cover 20 including the reinforcing rib exposed to the outside, the above-described structure can prevent the appearance of the image forming apparatus from being damaged. Since the user does not touch the reinforcing rib of the bottle cover 20, the user is not injured by the reinforcing rib. The reinforcing ribs can increase the rigidity of the inner cover 202 and the exterior cover 201 and increase the rigidity of the bottle cover 20 to be larger than the rigidity of the bottle cover including no reinforcing rib.

The pressing spring 203 presses the inner cover 202 and the exterior cover 201 to be away from each other in the Y direction. As a result, the hook 202a can butt against the edge of the hook hole 201a, which can prevent rattling of the inner cover 202 with respect to the exterior cover 201 due to the clearance D between the hook 202a and the hook hole 201a. Thus, the quality feeling of the bottle cover can be enhanced.

Figure 11:
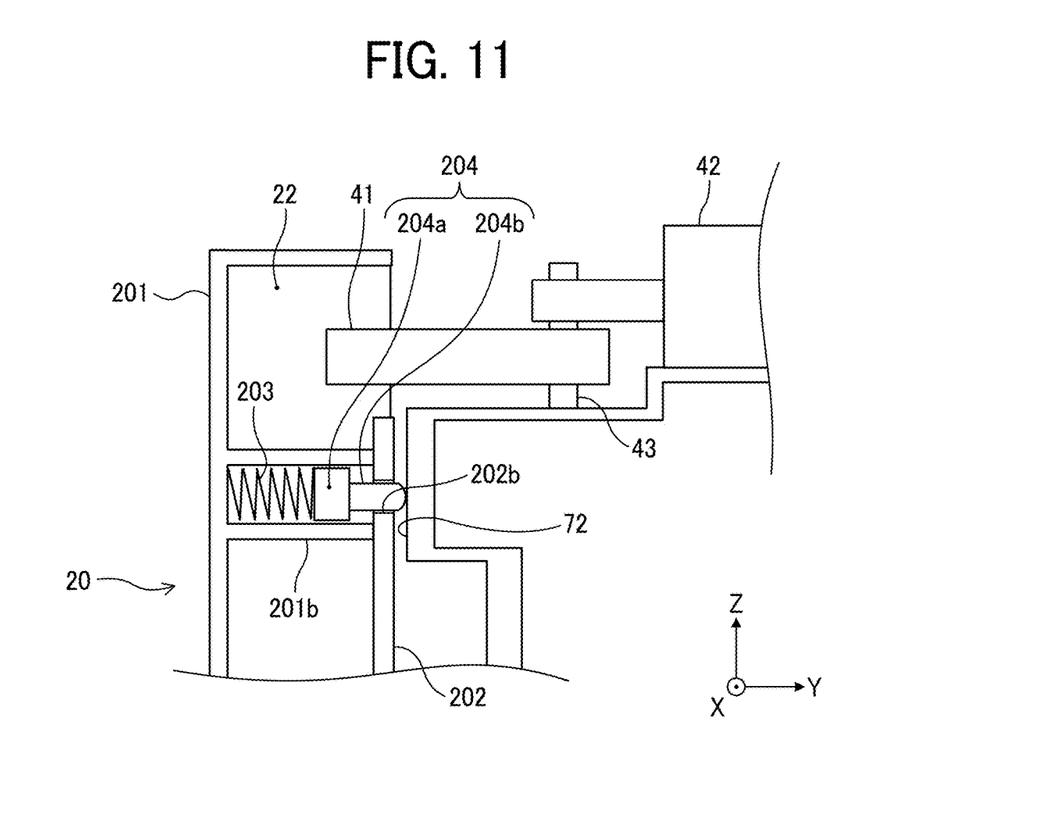
FIG. 11 is an enlarged schematic cross-sectional view of a part of the bottle cover locked at a closed position including a presser.

FIG. 11 is an enlarged schematic cross-sectional view of a part of the bottle cover 20 locked at the closed position and including the presser 204.

As illustrated in FIG. 11, a contact 72 of the apparatus main body pushes the projection 204b of the presser 204 to the front side (that is, toward the −Y direction) of the image forming apparatus against the urging force of the pressing spring 203, and the presser 204 is retracted into the bottle cover 20. As a result, the urging force of the pressing spring 203 does not act on the inner cover 202 and acts as an external force pressing the bottle cover 20 in an opening direction to open the bottle cover 20. When the lock device 40 is unlocked, the urging force of the pressing spring 203 automatically moves the bottle cover 20 from the closed position to the open position. When the pressing portion 204a of the presser 204 comes into contact with the inner cover 202, the urging force of the pressing spring 203 acts as an internal force to prevent the inner cover 202 from rattling relative to the exterior cover 201. The bottle cover 20 is closed by the operation of the user. Since the urging force of the pressing spring 203 prevents the rattling of the inner cover 202 with respect to the exterior cover 201 when the user closes the bottle cover 20, a high quality feeling can be given to the user.

On the other hand, since the urging force of the pressing spring 203 does not act on the inner cover 202 when the bottle cover 20 is closed, the inner cover 202 may rattle with respect to the exterior cover 201. However, since the bottle cover automatically opens, the user hardly touches the closed bottle cover. Accordingly, even if the inner cover 202 rattles with respect to the exterior cover 201 when the bottle cover 20 is closed, an impression that the quality of the bottle cover is poor is not given to the user.

Figure 12:
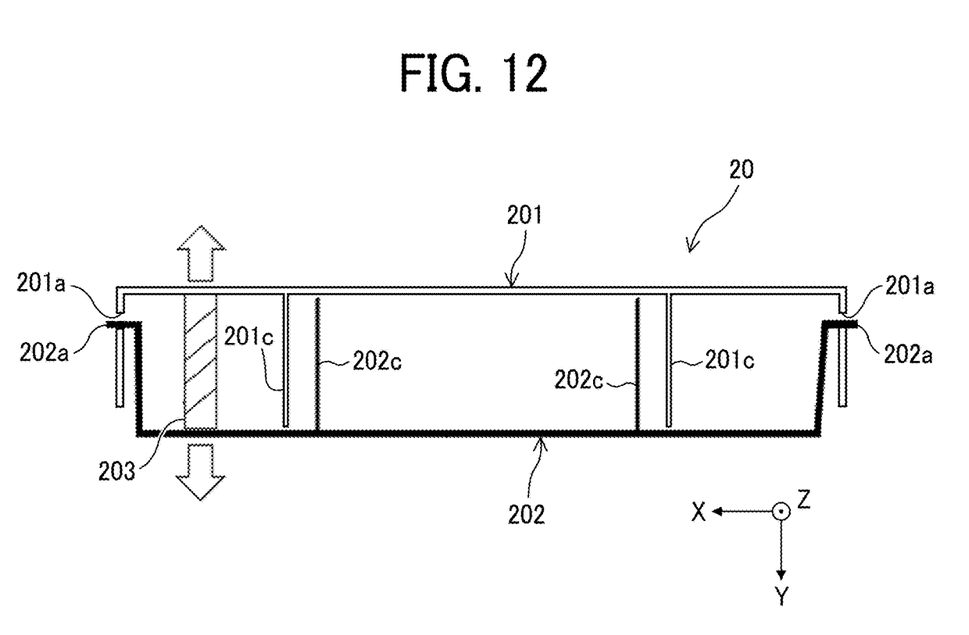
FIG. 12 is a schematic cross-sectional view of a modification of the bottle cover.

When the bottle cover 20 is automatically opened by its own weight, the presser 204 may be omitted as illustrated in FIG. 12. In the above-described structure, the pressing spring 203 can press the inner cover 202 and the exterior cover 201 to be away from each other even when the bottle cover is closed. As a result, the above-described structure can prevent the rattling of the inner cover 202 with respect to the exterior cover 201 even when the bottle cover 20 is closed.

The above-described embodiments are illustrative and do not limit this disclosure. Thus, numerous additional modifications and variations are possible in light of the above teachings. For example, elements and/or features of different illustrative embodiments may be combined with each other and/or substituted for each other within the scope of this disclosure.

For example, the present disclosure may be applied to an exterior door such as the front cover 3a of the image forming apparatus.

In addition to the above-described front cover 3a, examples of the exterior door include a right cover disposed on the right side of the image forming apparatus to open a duplex conveyance path and attach and detach the fixing device 10 and a waste toner cover to open and close a waste toner mounting portion on which a waste-toner container is mounted. When the present disclosure is applied to the exterior door, the double structure can increase the rigidity of the exterior door and enhance the quality feeling of the image forming apparatus.

The configurations according to the above-descried embodiments are examples, and embodiments of the present disclosure are not limited to the above. For example, the following aspects can achieve effects described below.

First Aspect

In a first aspect, an image forming apparatus such as the image forming apparatus 100 includes an apparatus main body and a cover such as the bottle cover 20. The cover openably closes the apparatus main body in a front-back direction and includes an inner cover such as the inner cover 202 and an exterior cover such as the exterior cover 201. The exterior cover is outside the inner cover in the front-back direction. The exterior cover is fitted to the inner cover to form a single body with the inner cover.

According to the first aspect, as described in the present embodiments, the cover having the double structure including the inner cover and the exterior cover can increase the rigidity of the cover to be higher than rigidity of a cover made by a single component. As a result, the above-described structure can prevent the cover from rattling due to insufficient rigidity and enhance the quality feeling of the image forming apparatus.

Second Aspect

In a second aspect, the image forming apparatus according to the first aspect further includes a reinforcing rib such as the reinforcing rib 201c or 202c. The reinforcing rib is on at least one of the inner cover such as the inner cover 202 or the exterior cover such as the exterior cover 201. The inner cover and the exterior cover surround the reinforcing rib.

According to the second aspect, as described in the present embodiments, the reinforcing rib can increase the rigidity of the cover such as the bottle cover 20. In addition, the reinforcing rib that is not exposed to the outside does not impair the aesthetic appearance of the image forming apparatus and can prevent the user from being injured by the reinforcing rib.

Third Aspect

In a third aspect, the image forming apparatus according to the first aspect or the second aspect further includes a hook such as the hook 202a. The hook is disposed on one of the inner cover such as the inner cover 202 and the exterior cover such as the exterior cover 201. Another of the inner cover and the exterior cover has a hook hole to which the hook is engaged.

According to the third aspect, as described in the present embodiments, the above-described structure enables attaching the inner cover such as the inner cover 202 to the exterior cover such as the exterior cover 201 without using a tool. Thus, the assembling workability can be simplified.

Fourth Aspect

In a fourth aspect, the image forming apparatus according to the third aspect further includes a spring such as the pressing spring 203. The spring is in a space surrounded by the inner cover such as the inner cover 202 and the exterior cover such as the exterior cover 201. The spring presses the inner cover and the exterior cover in a direction separating the inner cover away from the exterior cover.

According to the fourth aspect, as described in the present embodiments, the above-described structure can prevent the rattling of the inner cover such as the inner cover 202 with respect to the exterior cover such as the exterior cover 201 and enhance the quality feeling of the cover.

Fifth Aspect

In a fifth aspect, the image forming apparatus according to the fourth aspect further includes a lock such as the lock device 40, and the cover includes a presser such as the presser 204. The lock locks the cover such as the bottle cover 20 at a closed position. The presser includes a pressing portion such as the pressing portion 204a and a projection such as the projection 204b. The pressing portion is pressed by the spring such as the pressing spring 203 toward the inner cover such as the inner cover 202. The projection passes through a hole of the inner cover and projects from the inner cover. The projection such as the projection 204b in the cover at the closed position contacts the apparatus main body that presses the presser toward the exterior cover such as the exterior cover 201 to separate the pressing portion such as the pressing portion 204a from the inner cover.

According to the fifth aspect, as described in the present embodiments, the pressing portion such as the pressing portion 204a in the cover such as the bottle cover 20 at the closed position is separated from the inner cover, and thus the force of the spring such as the pressing spring 203 can press the cover such as the bottle cover 20 in the opening direction. As a result, the biasing force of the spring can automatically move the cover to the open position when the lock such as the lock device 40 is unlocked.

Sixth Aspect

In a sixth aspect, the apparatus main body in the image forming apparatus according to any one of the first to fifth aspects has an insertion opening into which a toner bottle is detachably attached, and the cover is configured to openably close the insertion opening.

According to the sixth aspect, the rigidity of the bottle cover can be enhanced.

The above-described embodiments are illustrative and do not limit the present disclosure. Thus, numerous additional modifications and variations are possible in light of the above teachings. For example, elements and/or features of the embodiment and variation may be combined with each other and/or substituted for each other within the scope of the present disclosure.

The advantages achieved by the embodiments described above are examples and therefore are not limited to those described above.

The invention claimed is:

1. An image forming apparatus comprising:
an apparatus main body;
a front cover to cover a front of the apparatus main body; and
a cover, disposed inside the apparatus main body and covered by the front cover when the front cover is closed, the cover including:
an inner cover, and
an exterior cover outside the inner cover in the front-back direction, the exterior cover fitted to the inner cover to form a single body with the inner cover, the single body being configured to openably close the apparatus main body in a front-back direction;
a hook on one of the inner cover and the exterior cover, another of the inner cover and the exterior cover having a hook hole to which the hook is engaged;
a spring in a space surrounded by the inner cover and the exterior cover, the spring pressing the inner cover and the exterior cover in a direction separating the inner cover away from the exterior cover;
a lock to lock the cover at a closed position,
wherein the cover includes a presser including:
a pressing portion pressed by the spring toward the inner cover; and
a projection passing through a hole of the inner cover and projecting from the inner cover, and the projection in the cover at the closed position contacts the apparatus main body that presses the presser toward the exterior cover to separate the pressing portion from the inner cover.

2. The image forming apparatus according to claim 1, wherein the lock includes a solenoid to control opening and closing of the lock, wherein energizing the solenoid causes the lock to open.

3. The image forming apparatus according to claim 2, further comprising:
an interlock switch to disconnect power to an electric motor of image former of the image forming apparatus when the front cover is opened, the interlock switch not disconnecting power from the solenoid when the front cover is opened.

4. The image forming apparatus according to claim 3, further comprising:
a fuse to disconnect power to the solenoid in a case that the solenoid causes a short circuit.

5. The image forming apparatus according to claim 2, wherein the solenoid causes a lock claw to disengage from a lock hole in the cover in order to open the lock.

* * * * *